United States Patent
Liu et al.

(10) Patent No.: US 6,184,105 B1
(45) Date of Patent: Feb. 6, 2001

(54) METHOD FOR POST TRANSISTOR ISOLATION

(75) Inventors: Yowjuang W. Liu; Sunil D. Mehta, both of San Jose, CA (US)

(73) Assignee: Advanced Micro Devices, Sunnyvale, CA (US)

(*) Notice: Under 35 U.S.C. 154(b), the term of this patent shall be extended for 0 days.

(21) Appl. No.: 08/861,553

(22) Filed: May 22, 1997

(51) Int. Cl.[7] .................................................... H01L 21/76
(52) U.S. Cl. ........................... 438/424; 438/624; 438/626
(58) Field of Search .................................. 438/404–452, 438/624, 626

(56) References Cited

U.S. PATENT DOCUMENTS

| | | |
|---|---|---|
| 4,905,065 | 2/1990 | Selcuk et al. . |
| 5,445,989 | 8/1995 | Lur et al. . |
| 5,445,990 | 8/1995 | Yook et al. . |
| 5,457,339 | 10/1995 | Komori et al. . |
| 5,459,096 | 10/1995 | Venkatesan et al. . |
| 5,460,998 | 10/1995 | Liu . |
| 5,466,623 | 11/1995 | Shimize et al. . |
| 5,468,675 | 11/1995 | Kaigawa . |
| 5,468,676 | 11/1995 | Madan . |
| 5,470,783 | 11/1995 | Chiu et al. . |
| 5,472,904 | 12/1995 | Figura et al. . |
| 5,472,905 | 12/1995 | Paek et al. . |
| 5,472,906 | 12/1995 | Shimize et al. . |
| 5,473,186 | 12/1995 | Morita . |
| 5,474,953 | 12/1995 | Shimizu et al. . |

FOREIGN PATENT DOCUMENTS

| | | | |
|---|---|---|---|
| 0 317 152 | * | 11/1988 | (EP) . |
| 0 513 639 A2 | * | 5/1992 | (EP) . |
| 0 724 291 A2 | * | 7/1996 | (EP) . |
| 59-256159 | * | 4/1984 | (JP) . |

OTHER PUBLICATIONS

Jambotkar "Method to Fabricate Very Dense EPROM Cell Arrays", IBM Technical Disclosure Bulletin, Dec. 1981.*

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu "Electrical Properties for MOS LSI's Fabricated Using Stacked Oxide SWAMI Technology" IEEE Transactions on Electron Devices, vol. ED–34, No 2, Feb. 1987.

* cited by examiner

Primary Examiner—Jey Tsai
(74) Attorney, Agent, or Firm—Foley & Lardner

(57) ABSTRACT

A method of fabricating integrated circuit including field effect transistors (FET) having source and drain regions and a gate and with LOCOS isolation by selectively forming, after the FETs are fabricated, trench openings in the source or drain regions or in the LOCOS isolation to maximize the isolation in selected areas while reducing the amount of silicon used by the isolation.

10 Claims, 4 Drawing Sheets

METHOD FOR POST TRANSISTOR ISOLATION

FIELD OF THE INVENTION

This invention relates to fabricating an integrated circuit with field oxide isolation of transistors in the integrated circuit.

BACKGROUND OF THE INVENTION

With increasing levels of integrated circuits in semiconductor chips or dies, such as those with a silicon substrate, several conflicting demands are put on the integrated circuit process. Today's integrated circuits demand high performance and high density, but also require low leakage currents to minimize power consumption. As the layout of the integrated circuit positions the transistors closer and closer together, it becomes increasing difficult to isolate the transistors so that parasitic leakage currents do not result.

Isolation of the transistors is generally accomplished by separating the individual transistors areas with a insulating material such as an oxide of silicon. The isolation, commonly known as field oxidation, is formed by either a LOCOS method in which the transistor area is masked and the isolation area is thermally oxidized, or by a trench isolation method in which an opening is forming in the silicon and filled with insulation. Normally, the trench, which varies in width, is a shallow trench in depth and is known as shallow trench isolation or STI.

The field oxidation is formed before the transistors with both of the LOCOS and STI methods. The STI provides the advantage of using less silicon than LOCOS thereby permitting a greater number of transistors for the same amount of silicon. However, it has been found that the STI degrades the quality of the subsequently thermally grown gate oxide of the transistor, especially at the STI edge, and is still susceptible to leakage along the edge of the STI. Further, the surface of the STIs, both wide and narrow, are simultaneously planarized after formation of the STIs which causes dishing of the wide STIs. In contrast, the LOCOS method does not degrade the quality of the thermally grown oxide gate nor cause junction leakage problems. However, LOCOS does encroach into the transistor areas and does not allow the same number of transistors for the same amount of silicon. Further, LOCOS does not allow scaling of diffusions (e.g., N+ to P+ or N+ to N+ or P+ to P+) without confronting the problem of leakage.

It would be desirable to maximize the use of LOCOS and its non-degrading and non-leakage advantages while maximizing the density advantage of STI without incurring its disadvantages.

SUMMARY OF THE INVENTION

The primary object of the present invention is provide a method of fabricating integrated circuits which increases the packing density of the transistors minimizing the parasitic transistor and leakage problems of STI.

Another object of the present invention is provide a method of fabricating integrated circuits to permit selectivity in the use of STI for isolation.

A further object of the present invention is to provide a method of fabricating integrated circuits with STI without affecting the quality of the gate oxide of the transistors.

These objects are achieved in accordance with the present invention by a method which comprising the following steps:

forming a trench opening in the silicon substrate after the formation of all of the FETs and the LOCOS isolation; and filling the trench opening with an insulating material.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
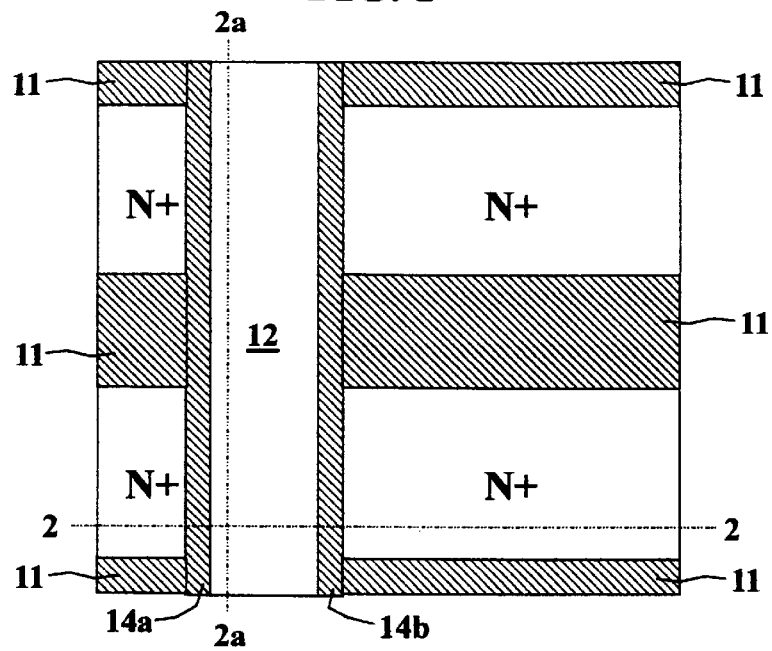
FIG. 1 is a plan view of a portion of a semiconductor substrate showing two transistor areas having a gate of an field effect transistor (FET) with sidewalls extending across the two areas.
Figure 2:
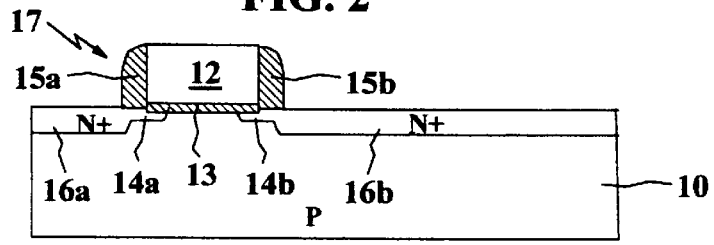
FIG. 2 is a cross-sectional view of the portion of the semiconductor substrate of FIG. 1 taken along line 2—2 of FIG. 1.
Figure 2A:
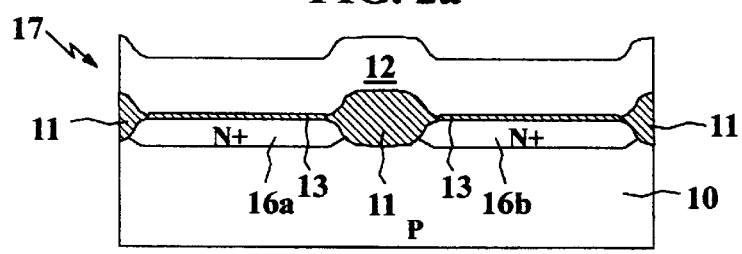
FIG. 2a is a cross-sectional view of the portion of the semiconductor substrate of FIG. 1 taken along 2a—2a of FIG. 1.

A preferred embodiment of the integrated circuit of the present invention includes field effect transistors (FET) and comprises a semiconductor substrate, herein a silicon substrate 10 with a {100} plane orientation, as shown in the plan view of FIG. 1 and the cross-sectional views of FIGS. 2 and 2a. The wafer 10 is doped with an appropriate impurity depending on whether the FETs are to be N-type or P-type. If the FETs are to be complementary N-type and P-type, such as a complementary metal oxide silicon (CMOS) FET, selected portions of the substrate 10 will be doped with an appropriate impurity to form wells in the complementary areas. To simplify the description of the present invention, a preferred embodiment of the integrated circuit starts with a conventional N-type FET and with the substrate 10 doped with a P-type impurity, herein boron (B), and includes field oxidation throughout the integrated circuit, herein LOCOS 11, and an insulating layer, herein silicon oxide thermally grown on and in the silicon substrate 10 to form the gate oxide 13. A gate material, herein polysilicon which can be doped insitu or subsequently, such as during the formation of the source and drain, to lower the resistivity of the polysilicon, is deposited on the gate oxide 13 to create the gate 12. Lightly doped drain (LDD) regions 14a and 14b of the source and drain are formed in the silicon substrate using the gate as the alignment mask by preferably implanting a N-type impurity such as phosphorus. Sidewalls 15a and 15b are then constructed using a conformal insulating material and anisotropic etching. These sidewalls and the gate 12 comprise the alignment mask for creating the remaining portion of the source and drain 16a and 16b, respectively, using an N-type impurity, herein arsenic, preferably by implantation. If desired, the polysilicon gate can be implanted during either one or both of these implantation so as to lower the resistivity of the polysilicon. To activate and diffuse the implanted ions in the LDD region, the remaining portion of the source and drain, and optionally the polysilicon gate, the silicon substrate 10 is rapidly thermally annealed to complete the FET 17. The field oxidation as shown in FIGS. 1, 2 and 2a relative to the FET 17, separates the FET 17 and the other transistors (not shown) of the integrated circuit from each other throughout the integrated circuit with conventional LOCOS isolation.

Figure 3:
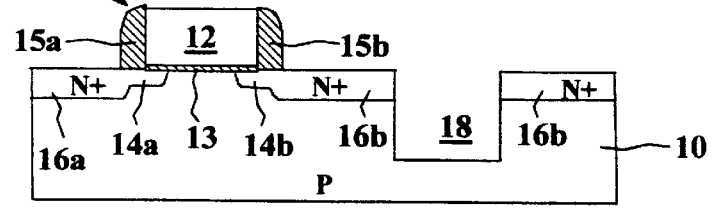
FIG. 3 is a cross-sectional view of the portion of the semiconductor substrate of FIG. 2 with an opening formed in the semiconductor substrate.
Figure 4:
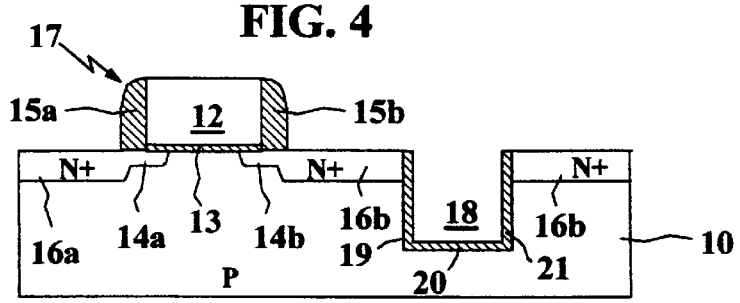
FIG. 4 is a cross-sectional view of the portion of the semiconductor substrate of FIG. 3 with an optional insulating liner on the walls and bottom of the opening.
Figure 5:
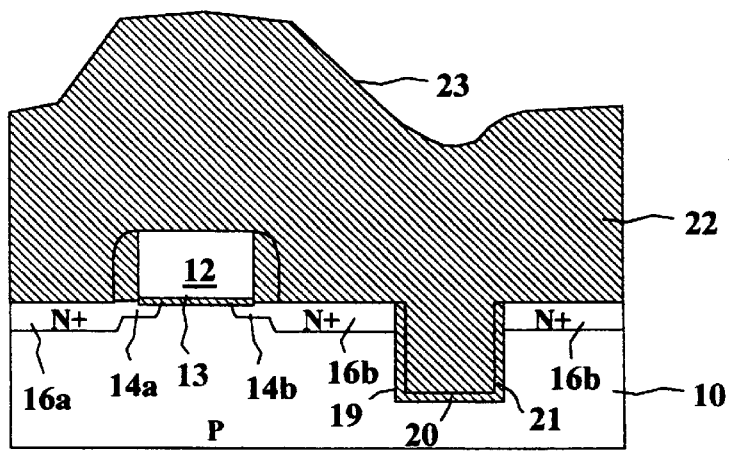
FIG. 5 is a cross-sectional view of the portion of the semiconductor substrate of FIG. 4 with the lined opening filled with insulating material serving as first level insulation.
Figure 6:
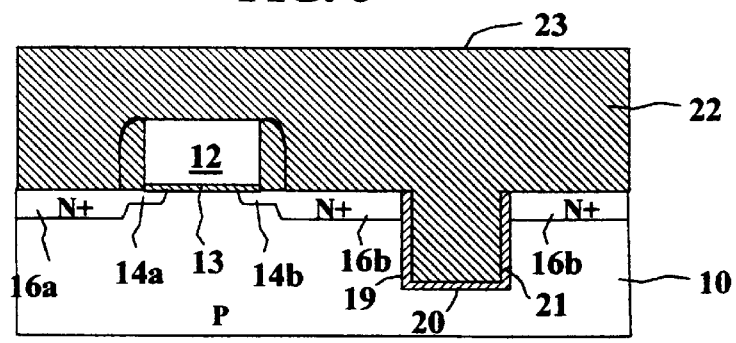
FIG. 6 is a cross-sectional view of the portion of the semiconductor substrate of FIG. 5 with the upper surface of the first level of insulation planarized.

Now, in accordance with the present invention of this preferred embodiment, trench isolation, herein shallow trench isolation (STI), is formed in the extended active area, herein drain region 16b, by first masking all but the area for the trench with photoresist (not shown) and then anisotropically etching a shallow trench opening 18, as shown in FIG. 3, using a parallel plate reactive ion etcher or an equivalent anisotropical etcher (not shown) and an etchant gas or gas mixture of preferably carbon tetrafluoride. Other known gases for plasma etching silicon may also be used. Alternatively, an electron cyclotron resonance (ECR) plasma reactor can be used for both etching the opening and subsequently filling the opening and provides the advantage of filling the opening without any voids in the silicon oxide by a deposition and etching process during filling. Optionally, the walls 19 and bottom 20 of the trench can be thermally oxidized to grow silicon oxide as a liner 21 on the walls and bottom of the trench opening as shown in FIG. 4. The optionally lined trench opening 18 is then filled with a deposited insulation material. Herein, silicon oxide 22 is chemically vapor deposited preferably using tetraethylorthosilicate (TEOS) as a conformal source which, as a feature of the present invention also serves as the first level of insulation for the local interconnect portion of the interconnection levels, as shown in FIG. 5. In preparation for forming the local interconnects and contact vias to the active regions of the transistors for the first level of interconnection, the surface 23 of the insulating material 22 is planarized, as shown in FIG. 6, preferably by chemical/mechanical polishing using commercially available equipment, pads and slurry. The source, drain and gate of FET 17 is interconnected by contact vias (not shown) surrounded by the silicon oxide insulation 22. Metal silicides (not shown), such as titanium silicide, may be at the interface of the contact vias and source, drain and gates of the FETs.

Another preferred embodiment of the integrated circuit starts with a conventional N-type FET and with a substrate 30 doped with a P-type impurity, herein boron (B), and includes a insulating layer, herein silicon oxide thermally grown on and in the silicon substrate 30 to form the gate oxide 31. A gate material, herein polysilicon which can be doped insitu or subsequently, such as during the formation of the source and drain, to lower the resistivity of the polysilicon, is deposited on the gate oxide 31 to create the gate 32. Lightly doped drain (LDD) regions 33a and 33b of the source and drain, respectively, are formed in the silicon substrate using the gate 32 as the alignment mask by preferably implanting a N-type impurity such as phosphorus (P). Sidewalls 34a and 34b are then constructed using a conformal insulating material and anisotropic etching as is known in the semiconductor technology. These sidewalls and the gate 32 comprise the alignment mask for creating the remaining portion of the source and drain 35a and 35b using an N-type impurity, herein arsenic (As), preferably by implantation. If desired, the polysilicon gate can be implanted during either one or both of these implantation so as to lower the resistivity of the polysilicon.

Figure 7:
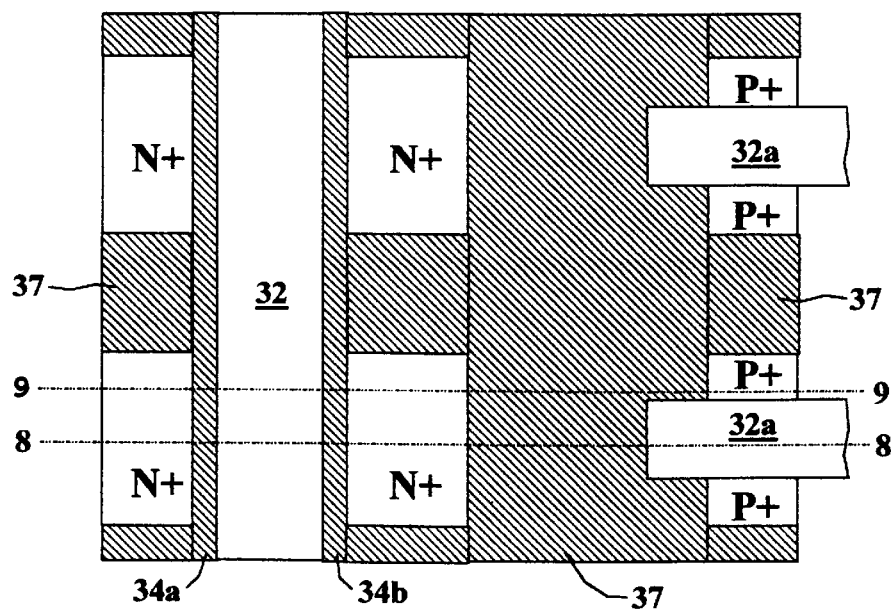
FIG. 7 is a plan view of a portion of a semiconductor substrate showing two transistor areas with a gate of an field effect transistor (FET) with sidewalls and with LOCOS isolation extending across the two areas and separating two other active areas having conductive layers disposed thereon.
Figure 8:
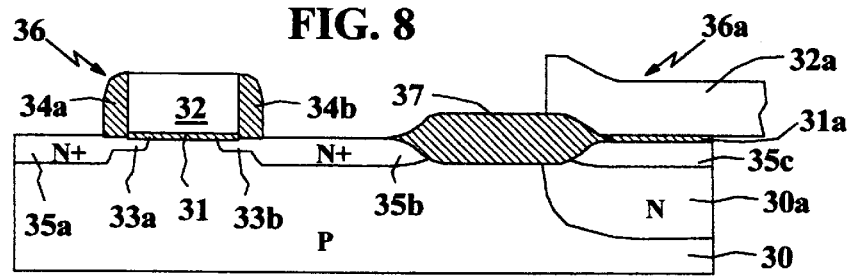
FIG. 8 is a cross-sectional view of the portion of the semiconductor substrate of FIG. 7 taken along line 8—8 of FIG. 7.
Figure 9:
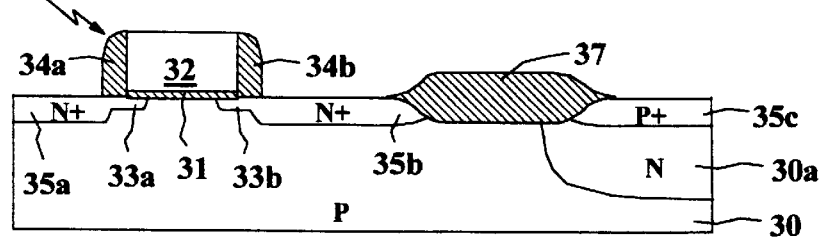
FIG. 9 is a cross-sectional view of the portion of the semiconductor substrate of FIG. 7 taken along line 9—9 of FIG. 7.

The N-type FET area is masked (not shown) and a P-type impurity herein boron, is implanted into the substrate 30 and into an N well 30a which had been previously formed by implanting an N-type impurity phosphorous as shown in FIGS. 7, 8 and 9. The N well 30a was formed in the substrate 30 before the formation of the LOCOS and gate oxide. After the P-type impurity s implanted and before the gate oxide 31 is grown and the polysilicon deposited for the gate 32, the oxide is grown in both areas for gate oxide 31 and oxide layer 31a and the polysilicon is deposited for both the gate 32 and the conductive layer 32a. The P+ active area 36a can either be formed to be a P channel FET or a capacitor as shown in FIG. 8. To activate and diffuse the implanted ions in the LDD region, the remaining portion of the source and drain the P+ regions, and optionally the polysilicon gate, the silicon substrate 30 is rapidly thermally annealed. Field oxidation throughout the integrated circuit is LOCOS 37, as shown in FIGS. 7, 8 and 9, to separate, for example, the FET 36 from other transistors (not shown) of the integrated circuit and the P+ active area 36a.

Figure 10:
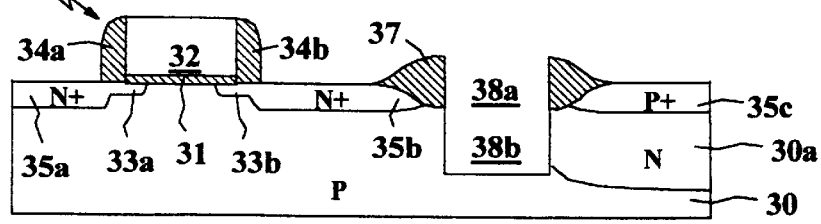
FIG. 10 is a cross-sectional view of a portion of the semiconductor substrate of FIG. 9 with an opening formed in the LOCOS and the semiconductor substrate.
Figure 11:
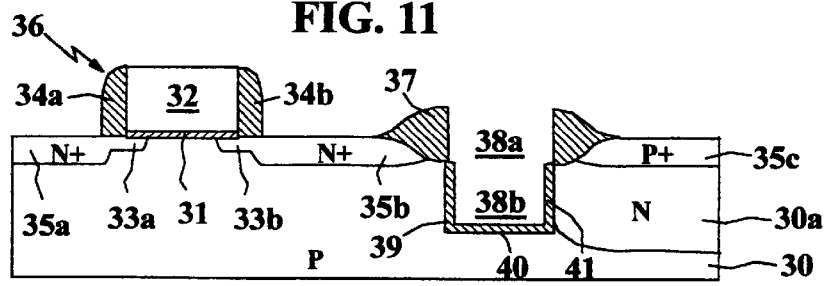
FIG. 11 is a cross-sectional view of the portion of the semiconductor substrate of FIG. 10 with an optional insulating liner on the walls and bottom of the opening in the silicon substrate.
Figure 12:
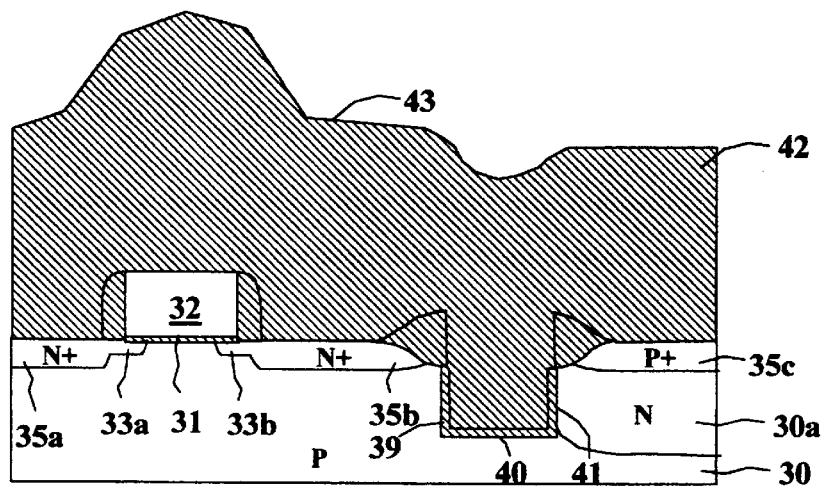
FIG. 12 is a cross-sectional view of the portion of the semiconductor substrate of FIG. 11 with the lined opening filled with insulating material serving as first level insulation.
Figure 13:
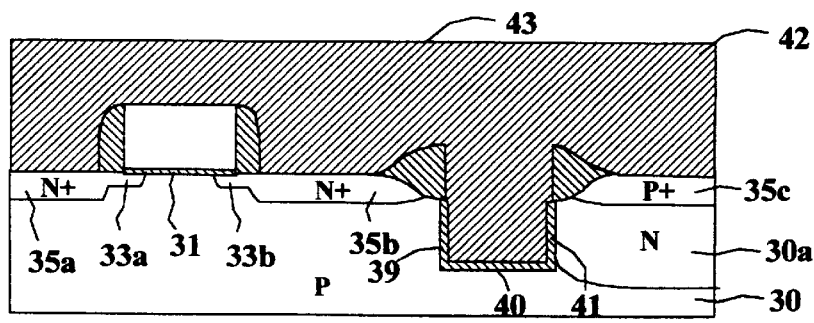
FIG. 13 is a cross-sectional view of the portion of the semiconductor substrate of FIG. 12 with the upper surface of the first level of insulation planarized.

Now, in accordance with the present invention of this preferred embodiment, additional isolation is required and trench isolation, herein shallow trench isolation (STI), is combined with the LOCOS 37 by first masking all but the area for the trench with photoresist (not shown) and then anisotropically etching a shallow trench opening 38a and 38b, as shown in FIG. 10, using a parallel plate reactive ion etcher or an equivalent anisotropical etcher (not shown) and an etchant gas or gas mixture. Herein, the etchant gas is first carbon tetrafluoride with hydrogen ($CF_4/H_2$) for etching an opening 38a in the silicon oxide LOCOS 37 and then, to continue to etch an opening 38b in the silicon substrate 10, carbon tetrafluoride ($CF_4$) alone or with oxygen ($CF_4/O_2$) is used as the etchant gas while still using the reactive ion etcher. Other known gases for plasma etching silicon may also be used. Alternatively, an electron cyclotron resonance (ECR) plasma reactor can be used for both etching the openings and subsequently filling the openings and provides the advantage of filling the openings without any voids in the silicon oxide by a deposition and etching process during filling. Optionally, the walls 40 and bottom 41 of the portion of the trench 38b in the silicon substrate can be thermally oxidized to grow silicon oxide as a liner 41 on the walls and bottom of the trench opening as shown in FIG. 11. The optionally lined trench opening 38b is then filed with a deposited insulation material 42, herein silicon oxide which, as a feature of the present invention also serves as the first level of insulation as shown in FIG. 12. The silicon oxide 42 is chemically vapor deposited preferably using tetraethylorthosilicate (TEOS) as a conformal source. In preparation for fabricating the local interconnects and vias to the active regions of the transistors for the first level of interconnection, the surface 42 of the insulating material 41 is planarized, as shown in FIG. 13, preferably by chemical/mechanical polishing using commercially available equipment, pads and slurry. The source, drain and gate of FET 36 and the P-type device 36a are interconnected by contact vias (not shown) surrounded by the silicon oxide insulation 41. Metal silicides (not shown), such as titanium silicide, may be at the interface of the contact vias and source, drain and gates of the FETs.

Although this invention has been described relative to specific materials, and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein which will be well understood by those skilled in the microelectronics and semiconductor arts after appreciating the present invention.

Having thus described the invention, what is claimed is:

1. A method of fabricating an integrated circuit in which field effect transistors (FETs) having a source, drain and gate are in and on a silicon substrate comprising the sequential steps of:

forming a pair of FETs in and on a silicon substrate and the pair of FETs having a source region of one FET connected to a drain region of the other FET in the silicon substrate and each having a gate above the silicon substrate surface;

forming a trench opening in the silicon substrate between the gates of said FETs and in the connected source and drain regions of the FETs to separate the source region of one FET from the drain region of the other FET;

filling said trench opening in the silicon substrate to form an insulating trench by depositing insulation in and above the trench opening to a height above the gate so that the insulation is sufficiently thick to serve as the insulating layer for local interconnects to the source, drain and gate; and planarizing the surface of the deposited insulation prior to forming the local interconnects.

2. The method of claim 1 wherein a oxide liner is thermally grown on the silicon walls and bottom of the trench opening in the silicon prior to filling the trench.

3. The method of claim 1 wherein the trench opening is formed by anisotropically etching.

4. The method of claim 1 wherein the trench opening is filled with an insulating material from a conformal source.

5. The method of claim 1 wherein the trench opening is filled with silicon oxide.

6. The method of claim 1 wherein the insulating material is planarized by chemical/mechanical polish.

7. A method of fabricating an integrated circuit containing field effect transistors (FETs) comprising the steps in sequence of:

forming at least a pair of FETs on and in a silicon substrate and each FET having a source and a drain region in the silicon substrate and a gate above the silicon substrate surface, the source of one FET connected to the drain of the other FET to form a common impurity region;

forming, after the formation of said pair of FETs, a trench opening in the silicon substrate between the gates and in said common impurity region of the pair of the FETs;

filling said trench opening in the silicon substrate to form an isolating trench by depositing insulation in and above the trench opening to a height above the gate so that the insulation is sufficiently thick to serve as the insulating layer for local interconnects to the source, drain and gate; and planarizing the surface of the deposited insulation prior to forming local interconnects.

8. The method of claim 7 wherein an oxide liner is thermally grown on the silicon walls and the bottom of the trench opening prior to filling the opening.

9. The method of claim 7 wherein the trench opening is formed in drain region of one FET of the pair and the source region of the other FET of the pair.

10. The method of claim 7 wherein the pair of FETs become isolated from each other by insulation only after the formation and filling of the trench opening.

* * * * *